US012747494B2

(12) United States Patent
Cho

(10) Patent No.: US 12,747,494 B2
(45) Date of Patent: Sep. 29, 2026

(54) MASK ASSEMBLY, METHOD OF MANUFACTURING MASK ASSEMBLY, AND METHOD AND APPARATUS FOR MANUFACTURING DISPLAY DEVICE

(71) Applicant: Samsung Display Co., LTD., Yongin-si (KR)

(72) Inventor: Wonje Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/788,702

(22) Filed: Jul. 30, 2024

(65) Prior Publication Data

US 2025/0075313 A1 Mar. 6, 2025

(30) Foreign Application Priority Data

Aug. 30, 2023 (KR) ........................ 10-2023-0114436

(51) Int. Cl.
*C23C 16/04* (2006.01)
*H10K 59/12* (2023.01)
*H10K 71/16* (2023.01)

(52) U.S. Cl.
CPC ....... *C23C 16/042* (2013.01); *H10K 59/1201* (2023.02); *H10K 71/166* (2023.02)

(58) Field of Classification Search
CPC .................................................... C23C 16/042
See application file for complete search history.

(56) References Cited

U.S. PATENT DOCUMENTS

| | | | | |
|---|---|---|---|---|
| 7,074,694 | B2 | 7/2006 | Kuwahara et al. | |
| 10,644,239 | B2 | 5/2020 | Ghosh et al. | |
| 10,934,614 | B2 | 3/2021 | Sakio et al. | |
| 11,038,009 | B2 | 6/2021 | Ju et al. | |
| 2020/0259126 | A1* | 8/2020 | Moon | C23C 14/042 |
| 2021/0359210 | A1* | 11/2021 | Dong | B05C 21/005 |
| 2022/0042159 | A1* | 2/2022 | Cho | C23C 14/08 |

FOREIGN PATENT DOCUMENTS

| | | | |
|---|---|---|---|
| CN | 1578563 | A | 2/2005 |
| CN | 108735915 | B | 2/2021 |
| JP | 6510129 | B2 | 4/2019 |

* cited by examiner

*Primary Examiner* — Robert A Vetere
(74) *Attorney, Agent, or Firm* — CANTOR COLBURN LLP

(57) ABSTRACT

Provided are a mask assembly, a method of manufacturing a mask assembly, and a method and apparatus for manufacturing a display device using a mask assembly. The mask assembly includes: a support defining a first opening therein; a connection portion defining a second opening therein, arranged on the support, and comprising at least one of metal, metal oxide, metal nitride, and alloy thereof, wherein the second opening corresponds to the first opening; and a mask arranged on the connection portion, configured to shield the first opening and the second opening, and defining a plurality of pattern holes corresponding to the first opening and the second opening.

5 Claims, 16 Drawing Sheets

MASK ASSEMBLY, METHOD OF MANUFACTURING MASK ASSEMBLY, AND METHOD AND APPARATUS FOR MANUFACTURING DISPLAY DEVICE

This application claims priority to Korean Patent Application No. 10-2023-0114436, filed on Aug. 30, 2023, and all the benefits accruing therefrom under 35 U.S.C. § 119, the content of which in its entirety is herein incorporated by reference.

BACKGROUND

1. Field

One or more embodiments relate to a method and an apparatus, and more particularly, to a mask assembly and a method and apparatus for manufacturing a display device.

2. Description of the Related Art

Mobile electronic devices have been widely used. In addition to small electronic devices such as mobile phones, tablet personal computers ("PCs") have recently been widely used as mobile electronic devices.

In order to support various functions, such mobile electronic devices include a display device for providing a user with visual information, such as images or video. Recently, as other parts for driving the display device have become smaller, the proportion occupied by display devices in electronic devices has been gradually increasing, and a structure capable of being bent in a flat state to have a certain angle has also been developed.

SUMMARY

As display devices are applied to various fields and become smaller, it is considerably important for display devices to have pixels arranged to have a precise pattern. In this regard, pixels may be formed by stacking a plurality of layers, and in order to form pixels having a precise pattern, it is a considerably important issue that at least one of the plurality of layers has a deposition material accurately disposed at the pixels. One or more embodiments include a mask assembly in which a display device having pixels in a precise pattern may be manufactured, and a method and apparatus for manufacturing a display device.

Additional aspects will be set forth in part in the description which follows and, in part, will be apparent from the description, or may be learned by practice of the presented embodiments of the disclosure.

According to one or more embodiments, a mask assembly includes: a support defining a first opening therein; a connection portion defining a second opening therein, arranged on the support, and including at least one of metal, metal oxide, metal nitride, and alloy thereof, where the second opening corresponds to the first opening; and a mask arranged on the connection portion, configured to shield the first opening and the second opening, and defining a plurality of pattern holes corresponding to the first opening and the second opening.

In the present embodiment, the support may include silicon.

In the present embodiment, the connection portion may include at least two layers stacked on each other.

In the present embodiment, the mask may include at least one of silicon oxide, silicon nitride, and silicon oxynitride.

In the present embodiment, a width of the pattern holes in a plan view may decrease in a direction away from the support.

In the present embodiment, a width of the pattern holes in a plan view may decrease in a direction away from the support, from one surface of the mask facing the connection portion to one point of the pattern holes and may increase in the direction away from the support, from the one point of the pattern holes to another surface of the mask opposite to the one surface.

In the present embodiment, a width of the first opening may be the same as a width of the second opening in a plan view.

According to one or more embodiments, a method of manufacturing a mask assembly includes sequentially stacking a first base material and a second base material, forming, in the second base material, a plurality of process holes apart from each other, arranging a third base material on the second base material, forming, in the first base material, a first opening corresponding to the plurality of process holes, and forming a plurality of pattern holes in the third base material by removing the third base material arranged inside each of the process holes.

In the present embodiment, one surface of the third base material overlapping the plurality of process holes may include corrugation before the forming of the plurality of pattern holes.

In the present embodiment, the method may further include forming, in the second base material, a second opening corresponding to the first opening.

In the present embodiment, the method may further include arranging a cover member on the third base material.

In the present embodiment, the method may further include removing the cover member.

In the present embodiment, a width of the pattern holes in a plan view may decrease in a direction away from the first base material.

In the present embodiment, a width of the pattern holes in a plan view may decrease in a direction away from the first base material, from one surface of the third base material facing the second base material to one point of the pattern holes and may increase in the direction away from the first base material, from the one point of the pattern holes to another surface of the third base material opposite to the one surface.

In the present embodiment, the first base material may include silicon.

In the present embodiment, the second base material may include at least one of metal, metal oxide, metal nitride, and alloy thereof.

In the present embodiment, the third base material may include at least one of silicon oxide, silicon nitride, and silicon oxynitride.

In the present embodiment, the second base material may include at least two layers stacked on each other.

According to one or more embodiments, an apparatus for manufacturing a display device includes: a deposition source facing a substrate, and a mask assembly arranged between the substrate and the deposition source, where the mask assembly includes: a support defining a first opening therein; a connection portion defining a second opening therein, arranged on the support, and including at least one of metal, metal oxide, metal nitride, and alloy thereof, where the second opening corresponds to the first opening; and a mask arranged on the connection portion, configured to shield the first opening and the second opening, and defining a plurality of pattern holes corresponding to the first opening and the second opening.

In the present embodiment, the support may include silicon.

In the present embodiment, the connection portion may include at least two layers stacked on each other.

In the present embodiment, the mask may include at least one of silicon oxide, silicon nitride, and silicon oxynitride.

In the present embodiment, a width of the pattern holes in a plan view may decrease in a direction away from the support.

In the present embodiment, a width of the pattern holes in a plan view may decrease in a direction away from the support, from one surface of the mask facing the connection portion to one point of the pattern holes and may increase in the direction away from the support, from the one point of the pattern holes to another surface of the mask opposite to the one surface.

In the present embodiment, a width of the first opening may be the same as a width of the second opening in a plan view.

According to one or more embodiments, a method of manufacturing a display device includes: arranging a substrate and a mask assembly to face a deposition source; and supplying a deposition material from the deposition source to cause the deposition material to pass through the mask assembly and be deposited on the substrate, where the mask assembly includes: a support defining a first opening therein; a connection portion defining a second opening therein, arranged on the support, and including at least one of metal, metal oxide, metal nitride, and alloy thereof, where the second opening corresponds to the first opening; and a mask arranged on the connection portion, configured to shield the first opening and the second opening, and defining a plurality of pattern holes corresponding to the first opening and the second opening.

In the present embodiment, the support may include silicon.

In the present embodiment, the connection portion may include at least two layers stacked on each other.

In the present embodiment, the mask may include at least one of silicon oxide, silicon nitride, and silicon oxynitride.

In the present embodiment, a width of the pattern holes in a plan view may decrease in a direction away from the support.

In the present embodiment, a width of the pattern holes in a plan view may decrease in a direction away from the support, from one surface of the mask facing the connection portion to one point of the pattern holes and may increase in the direction away from the support, from the one point of the pattern holes to another surface of the mask opposite to the one surface.

In the present embodiment, a width of the first opening may be the same as a width of the second opening in a plan view.

These general and specific embodiments may be implemented by using a system, a method, a computer program, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
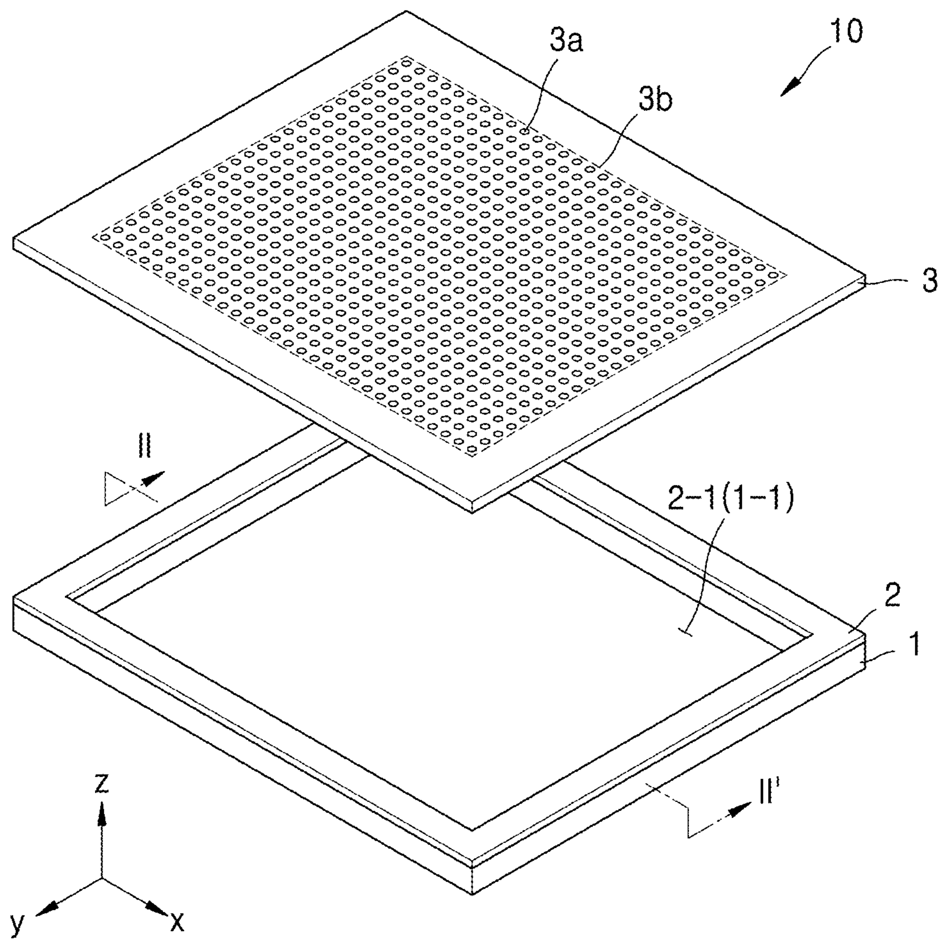
FIG. 1A is an exploded perspective view of a mask assembly according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

The x-axis direction, the y-axis direction, and the z-axis direction are not limited to three axes of the rectangular coordinate system and may be interpreted in a broader sense. For example, the x-axis direction, the y-axis direction, and the z-axis direction may be perpendicular to one another or may represent different directions that are not perpendicular to one another.

When an embodiment may be implemented differently, a certain process order may be performed differently from the described order. For example, two consecutively described processes may be performed substantially at the same time or performed in an order opposite to the described order.

Figure 1B:
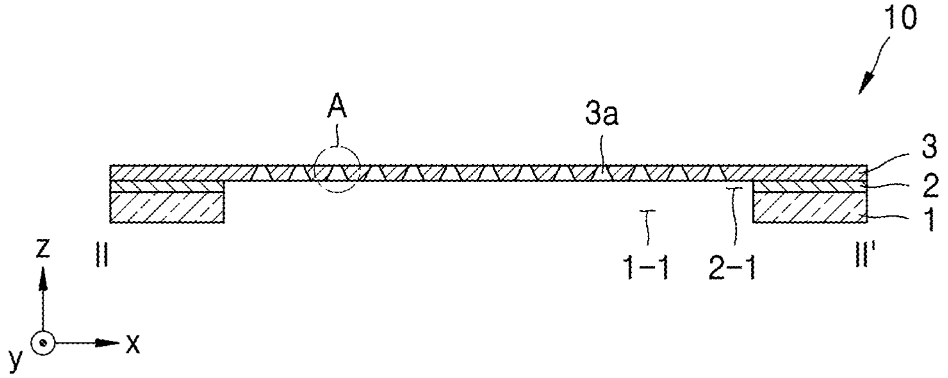
FIG. 1B is a cross-sectional view of the mask assembly of FIG. 1A, taken along line II-II' of FIG. 1A.
Figure 1C:
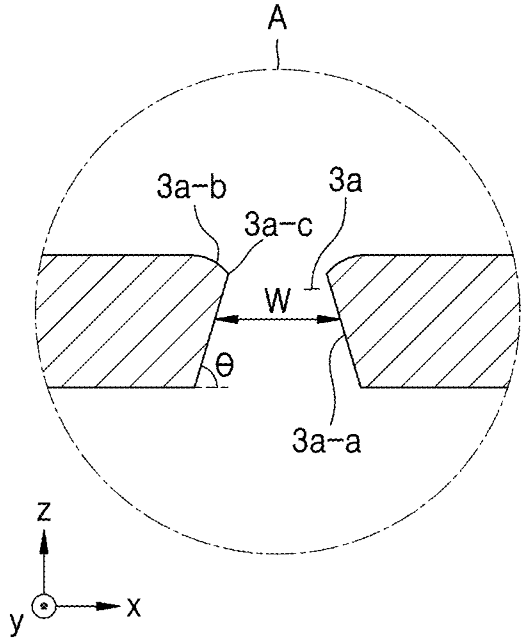
FIG. 1C is an enlarged cross-sectional view of a region A of FIG. 1B.

FIG. 1A is an exploded perspective view of a mask assembly 10 according to an embodiment. FIG. 1B is a cross-sectional view of the mask assembly 10 of FIG. 1A, taken along line II-II' of FIG. 1A. FIG. 1C is an enlarged cross-sectional view of a region A of FIG. 1B.

Referring to FIGS. 1A to 1C, the mask assembly 10 may include a support 1, a connection portion 2, and a mask 3.

The support 1 may define at least one first opening 1-1. The support 1 may include polysilicon. The support 1 may form the edge of the mask assembly 10.

The connection portion 2 may be disposed between the support 1 and the mask 3 to connect the support 1 to the mask 3. In this regard, the connection portion 2 may include at least one of metal, metal oxide, metal nitride, and alloy thereof. The metal may include aluminum (Al), chromium (Cr), copper (Cu), gold (Au), titanium (Ti), tantalum (Ta), tungsten (W), molybdenum (Mo), or nickel (Ni). The metal oxide or metal nitride may include oxide or nitride of aluminum (Al), chromium (Cr), copper (Cu), gold (Au), titanium (Ti), tantalum (Ta), tungsten (W), molybdenum (Mo), and/or nickel (Ni). The alloy may include Invar.

The connection portion 2 may define a second opening 2-1 therein. In this regard, the second opening 2-1 may correspond to the first opening 1-1. That is, a planar shape of the second opening 2-1 may be the same as or similar to the planar shape of the first opening 1-1. As used herein, the "planar shape" means a shape in a view from the z-axis direction.

The connection portion 2 may include at least one layer. When the connection portion 2 includes a plurality of layers, the plurality of layers may be stacked on each other. In this regard, each layer may include the same or similar material as the connection portion 2 described above. One among the plurality of layers stacked on each other may include a different material than another among the plurality of layers stacked on each other.

The mask 3 may be disposed on the connection portion 2. In this regard, the mask 3 may include an inorganic material. For example, the mask 3 may include one of silicon oxide ($SiO_x$), silicon nitride ($SiN_x$), and silicon oxynitride ($SiO_xN_y$). In another embodiment, the mask 3 may be a mixed layer of at least two of silicon oxide ($SiO_x$), silicon nitride ($SiN_x$), and silicon oxynitride ($SiO_xN_y$). In another embodiment, the mask 3 may include a layer including one of silicon oxide ($SiO_x$), silicon nitride ($SiN_x$), and silicon oxynitride ($SiO_xN_y$), and another layer including another of silicon oxide ($SiO_x$), silicon nitride ($SiN_x$), and silicon oxynitride ($SiO_xN_y$).

The mask 3 may define a plurality of pattern holes 3*a* therein. The plurality of pattern holes 3*a* may be apart from each other in column and row directions (e.g., x-axis direction and y-axis direction) within a deposition area 3*b* where a deposition material is deposited on a substrate (See display substrate DS in FIG. 6). The pattern holes 3*a* may have various planar shapes. For example, a planar shape of the pattern holes 3*a* may be a circle, as shown in FIG. 1A. In another embodiment, although not shown, a planar shape of the pattern holes 3*a* may be a polygon such as a triangle or a quadrangle.

A cross-section of the mask 3 through the pattern holes 3*a* and parallel to one direction (i.e., the z-axis direction of FIG. 1A) is shown in FIGS. 1B and 1C. In this regard, a width W of a pattern hole 3*a* may change in one direction (i.e., z-axis direction). For example, the width W of the pattern hole 3*a* may decrease in a direction (e.g., z-axis direction) away from the support 1 and the connection portion 2. That is, a surface (i.e., side surface) of the mask 3 defining the pattern hole 3*a* may be inclined, and the surface of the mask 3 defining the pattern hole 3*a* may have an acute inclination angle θ with respect to a surface (i.e., bottom surface) of the mask 3 in contact with the connection portion 2. In this regard, the inclination angle θ of the surface of the mask 3 defining the pattern hole 3*a* may be 85° or less. When the inclination angle θ of the surface of the mask 3 defining the pattern hole 3*a* is greater than 85°, a deposition material may be blocked by the surface of the mask 3 defining the pattern hole 3*a*, and thus, the range of a deposition material to be deposited on a substrate may be narrowed or a deposition material may not be deposited on the correct location. In the above case, a cross-sectional shape of the pattern hole 3*a* may be trapezoidal. The width W of the pattern hole 3*a* may be a distance between surfaces facing each other in a direction (a direction parallel to a plane defined by the x-axis direction and the y-axis direction) perpendicular to one direction (i.e., z-axis direction) among surfaces of the mask 3 defining the pattern hole 3*a*.

The width W of the pattern hole 3*a* described above may decrease and then increase in one direction (i.e., z-axis direction), as shown in FIG. 1C. For example, the width W of the pattern hole 3*a* may decrease from a first surface (i.e., bottom surface) of the mask 3 in contact with the connection portion 2 to the point 3*a-c*. The width W of the pattern hole 3*a* may increase from the point 3*a-c* to a second surface (i.e., top surface) of the mask 3. In this regard, the first surface and the second surface of the mask 3 may be surfaces facing each other in the z axis direction. Particularly, in the above case, the width W of the pattern hole 3*a* may decrease in a portion 3*a-a* of a side surface of the mask 3 defining the pattern hole 3*a*, and the width W of the pattern hole 3*a* may increase in another portion 3*a-b* of the side surface of the mask 3 defining the pattern hole 3*a*.

The mask assembly 10 described above may selectively allow a deposition material to pass through. More specifically, the deposition material may pass through the pattern holes 3*a* and reach only a certain area of a substrate (See display substrate DS in FIG. 6). In this regard, when the pattern holes 3*a* are upside down compared to those shown in FIG. 1B, not only is an inlet portion of the pattern holes 3*a* through which a deposition material flows in narrow, but an outlet portion through which the deposition material passes through the pattern holes 3*a* and flows out of the pattern holes 3*a* is wide, and accordingly, the deposition material may fail to be deposited at the location on a substrate, which is a member targeted for deposition, where the deposition material should have been deposited. However, the pattern holes 3*a* according to an embodiment may have a trapezoidal shape as described above, and thus, the above problem may not occur.

In addition, because the mask 3 includes an inorganic material, and the pattern holes 3*a* are arranged in the inorganic material, a deposition material pattern may be densely formed on a certain area of a substrate by using fine pattern holes 3*a*.

The mask assembly 10 may allow firm coupling between the mask 3 and the support 1 by coupling the mask 3 to the support 1 through the connection portion 2.

FIGS. 2A to 2F are cross-sectional views of a process of manufacturing the mask assembly 10 shown in FIG. 1A.

Figure 2A:
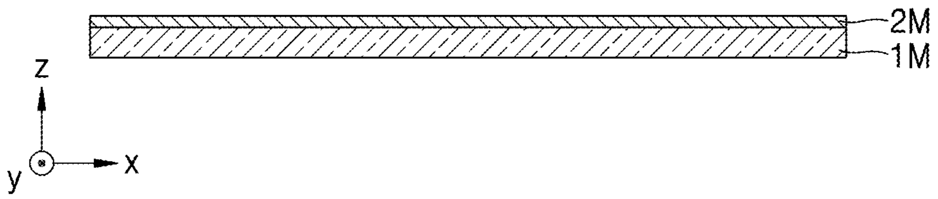
FIGS. 2A to 2F are cross-sectional views of a process of manufacturing the mask assembly shown in FIG. 1A.

Referring to FIG. 2A, a second base material 2M may be disposed on a first base material 1M. In this regard, the first base material 1M may be a silicon wafer. In addition, the second base material 2M may be disposed on the first base material 1M in various ways. For example, the second base material 2M may be formed on the first base material 1M by using a sputtering method or an evaporation method. In this regard, the second base material 2M may include the same or similar material as the connection portion 2 (refer to FIG. 1B) described above.

Figure 2B:
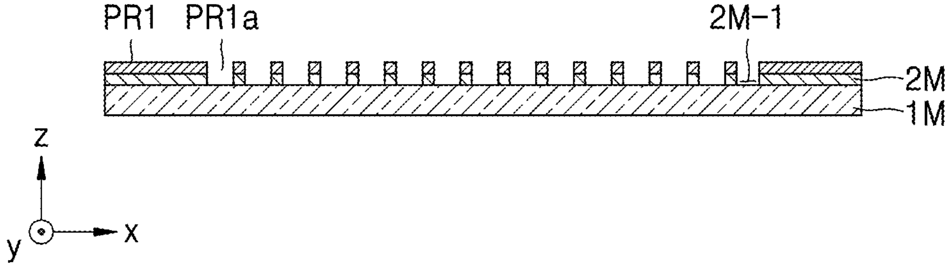

Referring to FIG. 2B, a first photoresist PR1 may be disposed on the second base material 2M, and a certain pattern may be formed through exposure and development processes on the first photoresist PR1. In this regard, a first hole PR1*a* may be formed in the first photoresist PR1, and thus, a portion of the second base material 2M where a process hole 2M-1 is to be formed may be exposed through the first hole PR1*a*. Afterwards, the portion of the second base material 2M exposed through the first hole PR1*a* may be removed through etching. In this regard, the etching method may be wet etching using a cleaning solution or dry etching using plasma, laser, etc.

Figure 2C:
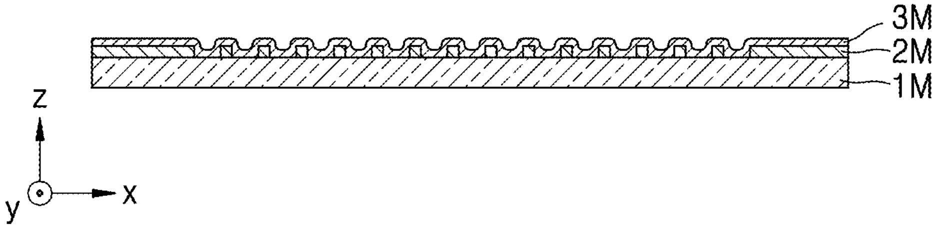

Referring to FIG. 2C, a third base material 3M may be disposed on the second base material 2M. In this regard, the third base material 3M may be disposed on the second base material 2M via plasma-enhanced chemical vapor deposition ("PECVD") or tetraethyl orthosilicate chemical vapor deposition ("TEOS CVD").

The third base material 3M may include the same or similar material as the mask 3. The third base material 3M may not only be disposed on the second base material 2M but also may be inserted into the process hole 2M-1 (refer to FIG. 2B). In this case, a portion of the third base material 3M arranged inside the process hole 2M-1 may be in direct contact with the first base material 1M. In addition, one surface of the third base material 3M may include corrugation.

Figure 2D:
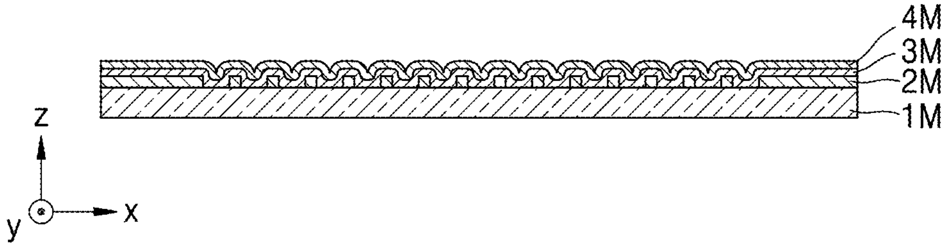

Referring to FIG. 2D, a cover member 4M may be disposed on the third base material 3M. In this regard, the cover member 4M may be in direct contact with a surface of the third base material 3M. A surface of a portion of the cover member 4M disposed on a corrugated portion of the third base material 3M may be in the form of corrugation.

Figure 2E:
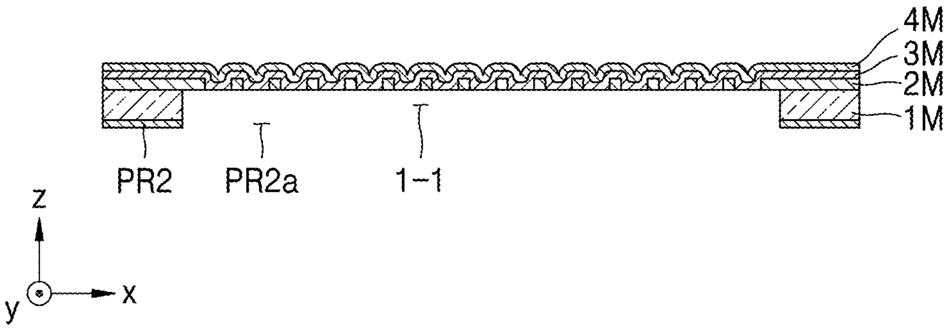

Referring to FIG. 2E, a second photoresist PR2 may be disposed on one surface (i.e., bottom surface) of the first base material 1M, and a second hole PR2*a* may be formed through exposure and development. In this regard, residue of the second photoresist PR2 may shield only a portion of one surface of the first base material 1M.

The first opening 1-1 may be formed by etching the first base material 1M on which the second photoresist PR2 is disposed. In this regard, the etching may be wet etching, in which an etching solution is sprayed into the second hole PR2*a*, or dry etching, in which plasma or laser is sprayed into the second hole PR2*a*. Although not shown, when wet etching is used, a surface of the first base material 1M defining the first opening 1-1 may be tapered in a similar way to the pattern hole 3*a*(refer to FIG. 1B) described above. In this regard, the surface of the first base material 1M defining the first opening 1-1 may be the opposite of a surface of the mask 3 (refer to FIG. 1B) defining the pattern hole 3*a*. In addition, when wet etching is used, the second base material 2M may be chromium (Cr), gold (Au), etc., which are not etched by an etching solution, or may be in the form of alloy, metal oxide, or metal nitride. Hereinafter, a case where the first base material 1M is etched using a dry etching method will be mainly described in detail for convenience of description.

As described above, the support 1 (refer to FIG. 1B) defining the first opening 1-1 therein may be formed by etching the first base material 1M. In this regard, a surface of the support 1 defining the first opening 1-1 may not be tapered but may be almost perpendicular to one surface of the support 1 on which the second base material 2M is seated. In addition, when the first opening 1-1 is formed, a portion of the second base material 2M and a portion of the third base material 3M may be externally exposed through the first opening 1-1.

Figure 2F:
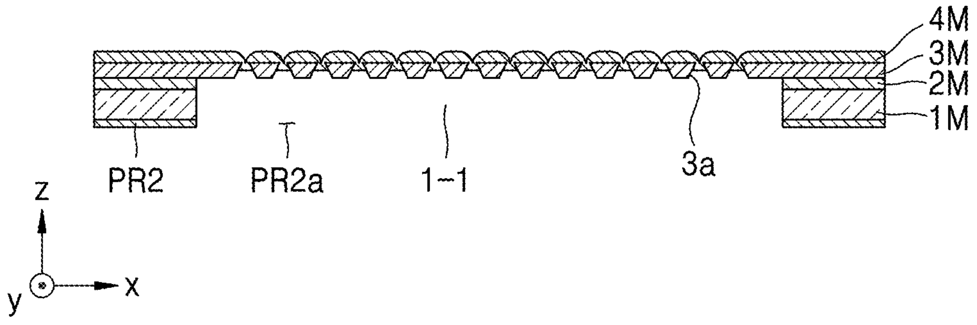

Referring to FIG. 2F, a portion of the third base material 3M may be etched through the first opening 1-1. In this regard, the third base material 3M may be removed through dry etching. In the above case, a portion of the third base material 3M arranged in the process hole 2M-1 (refer to FIG. 2B) may be removed. In addition, a portion of the second base material 2M arranged between process holes 2M-1 may protect a portion of the third base material 3M disposed on the second base material 2M during dry etching. In the above case, the pattern hole 3*a* may be formed. The pattern hole 3*a* may be formed by removing a portion of the third base material 3M arranged in the process hole 2M-1.

Once the above process is completed, a portion of the second base material 2M may be removed. More specifically, the second base material 2M may be removed through wet etching in which an etching solution is sprayed onto the second base material 2M externally exposed through the first opening 1-1. In addition, the etching solution may also be sprayed onto the cover member 4M, and thus, the cover member 4M may also be removed.

When a portion of the second base material 2M and the cover member 4M are removed as described above, the connection portion 2 (refer to FIG. 1B) defining the second opening 2-1 (refer to FIG. 1B) therein and the mask 3 defining the pattern holes 3*a* therein may be manufactured, and thus, the manufacture of the mask assembly 10 (refer to FIG. 1A) may be completed.

In the above case, the mask assembly 10 may include the pattern holes 3*a* having a width that decreases in a direction (i.e., z-axis direction) away from the support 1 (refer to FIG. 1B).

In addition, the pattern holes 3*a* to be formed in the mask 3 may be finely processed, and thus, the mask assembly 10 may allow the formation of as many patterns as possible in a certain area and accordingly may be used to manufacture a high-resolution display device.

Figure 3:
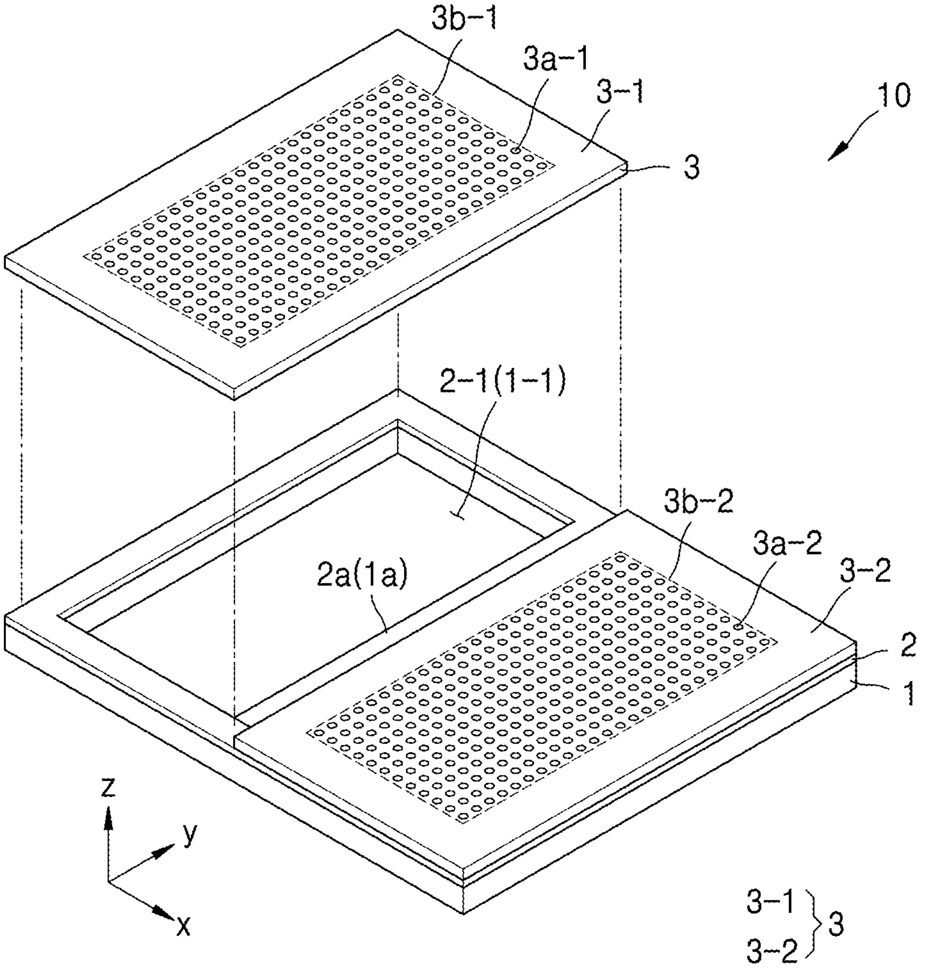
FIG. 3 is an exploded perspective view of a mask assembly according to another embodiment.

FIG. 3 is an exploded perspective view of the mask assembly 10 according to another embodiment.

Referring to FIG. 3, the mask assembly 10 may include the support 1, the connection portion 2, and the mask 3. In this regard, the support 1, the connection portion 2, and the mask 3 may be similar to those described above with reference to FIGS. 1A to 1C. Hereinafter, differences from the above descriptions will be mainly described in detail for convenience of description.

The support 1 may define a plurality of first openings 1-1 therein. In this regard, the support 1 may include a middle support 1*a* disposed between the plurality of first openings 1-1. The middle support 1*a* may define each of the first openings 1-1 and may support the mask 3.

The connection portion 2 may be disposed on the support 1. In this regard, the connection portion 2 may include a middle connection portion 2*a* disposed on the middle support 1*a*. The connection portion 2 may define a plurality of second openings 2-1 corresponding to the first openings 1-1, respectively.

The mask 3 may be provided in plurality, and the plurality of masks 3 may correspond to the first openings 1-1, respectively. That is, the plurality of masks 3 may overlap the first openings 1-1, respectively. For example, the plurality of masks 3 may include a first mask 3-1 and a second mask 3-2, which are separated from each other and disposed on the connection portion 2. In this regard, the middle support 1*a* may support the first mask 3-1 and the second mask 3-2 together. The first mask 3-1 and the second mask 3-2 may be separated from each other and connected to each other. In this case, the first mask 3-1 and the second mask 3-2 may be arranged such that one of the sides of the first mask 3-1 and one of the sides of the second mask 3-2 are in contact with each other. In another embodiment, the first mask 3-1 and the second mask 3-2 may be arranged such that one of the sides of the first mask 3-1 and one of the sides of the second mask 3-2 are apart from each other.

In the above case, the first mask 3-1 may include a plurality of first pattern holes 3*a*-1, which are pattern holes arranged in columns and rows inside a first deposition area 3*b*-1. In addition, the second mask 3-2 may include a plurality of second pattern holes 3*a*-2, which are pattern holes arranged in columns and rows inside a second deposition area 3*b*-2. In the above case, the first deposition area 3*b*-1 and the second deposition area 3*b*-2 may correspond to different areas of a substrate (See display substrate DS in FIG. 6) from each other. In addition, each of the first deposition area 3*b*-1 and the second deposition area 3*b*-2 may correspond to one display area described below. In another embodiment, the first deposition area 3*b*-1 and the second deposition area 3*b*-2 may correspond to different substrates, respectively.

Figure 4:
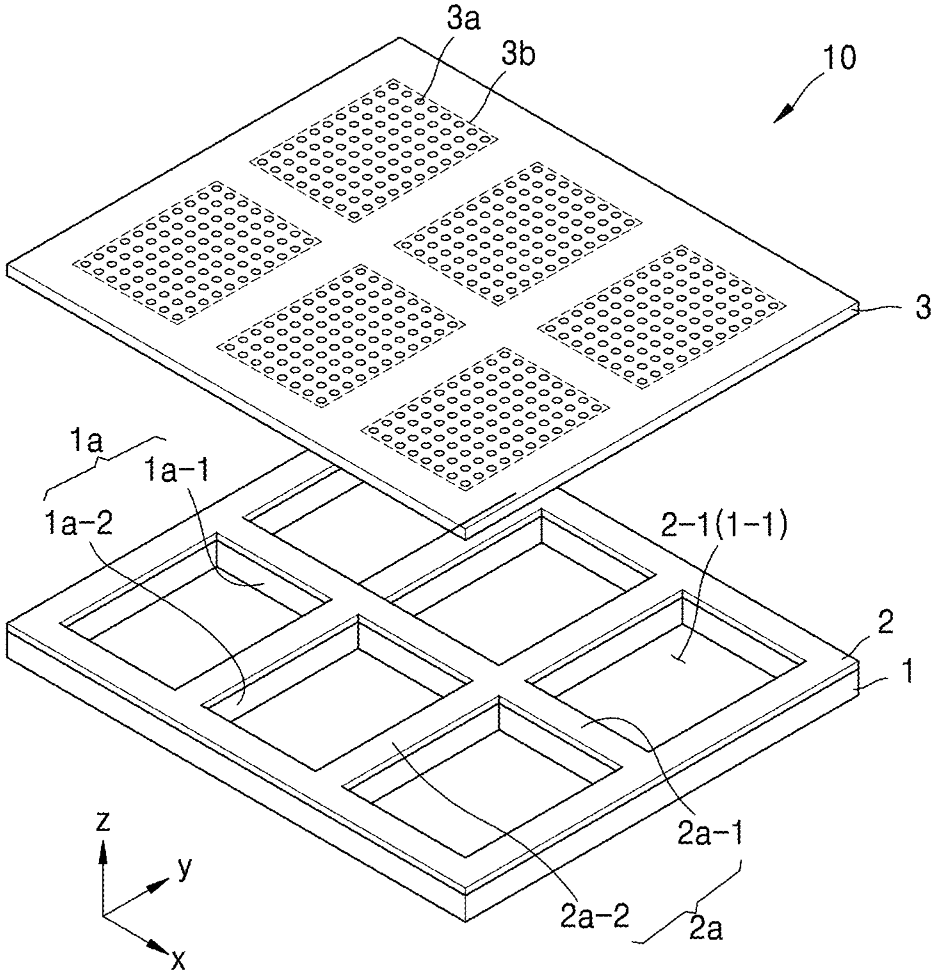
FIG. 4 is an exploded perspective view of a mask assembly according to still another embodiment.

FIG. 4 is an exploded perspective view of the mask assembly 10 according to still another embodiment.

Referring to FIG. 4, the mask assembly 10 may include the support 1, the connection portion 2, and the mask 3. In this regard, the support 1, the connection portion 2, and the mask 3 may be similar to those described above with reference to FIGS. 1A to 1C. Hereinafter, differences from the above descriptions will be mainly described in detail for convenience of description.

The support 1 may include a first middle support 1*a*-1 and a second middle support 1*a*-2 crossing each other. In this regard, the first middle support 1*a*-1 and the second middle support 1*a*-2 may be arranged in a grid and may define a plurality of first openings 1-1. That is, the first middle support 1*a*-1 or the second middle support 1*a*-2 may be arranged between adjacent first openings 1-1. In the above case, the support 1 may be in the form of a window frame.

The connection portion 2 may be disposed on the support 1. In this regard, the connection portion 2 may include a first middle connection portion 2*a*-1 and a second middle connection portion 2*a*-2 disposed on the first middle support 1*a*-1 and the second middle support 1*a*-2, respectively. In this regard, the connection portion 2 may be in the form of a window frame in a similar way to the support 1 and may define a plurality of second openings 2-1 corresponding to the first openings 1-1, respectively.

The mask 3 may cover the entirety of the connection portion 2. In this regard, the mask 3 may include a plurality of deposition areas 3*b* apart from each other. In this case, a portion of the mask 3 where pattern holes 3*a* are not formed may be arranged between the plurality of deposition areas 3*b*. In this regard, each deposition area 3*b* may correspond to each second opening 2-1 and thus may allow a deposition material having passed through the first opening 1-1 and the second opening 2-1 to pass through. That is, each deposition area 3*b* may overlap each second opening 2-1 in a plan view. The plurality of pattern holes 3*a* may be apart from each other in columns and rows in each deposition area 3*b*.

Although not shown, the mask 3 may include a plurality of masks 3. In this case, one mask 3 may overlap one second opening 2-1, or one mask 3 may overlap at least two of the plurality of second openings 2-1 in a plan view.

Figure 5:
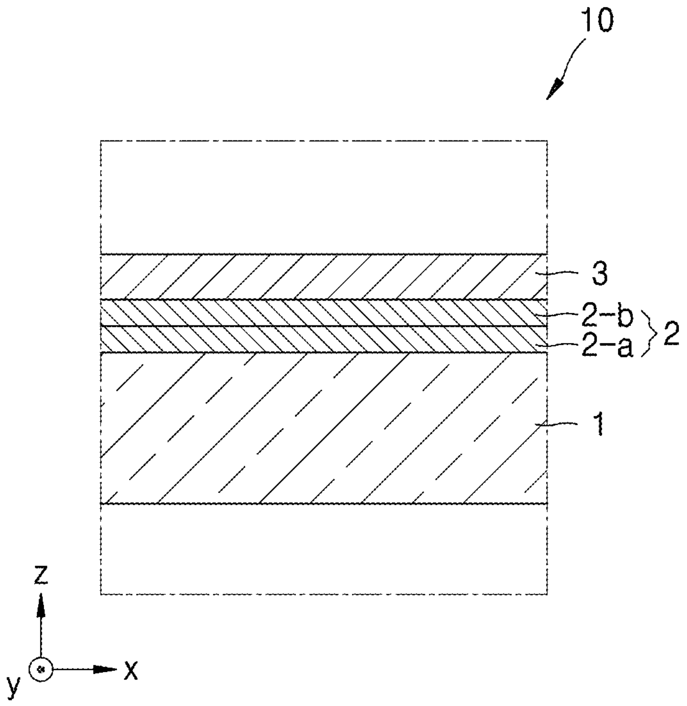
FIG. 5 is a cross-sectional view of a portion of a mask assembly according to another embodiment.

FIG. 5 is a cross-sectional view of a portion of the mask assembly 10 according to another embodiment.

Referring to FIG. 5, the mask assembly 10 may include the support 1, the connection portion 2, and the mask 3. In this regard, the support 1 and the mask 3 are the same as or similar to those described above with reference to FIG. 1A, 3, or 4, and thus, a detailed description thereof is omitted.

The connection portion 2 may include a plurality of layers stacked on each other. Hereinafter, a case where the connection portion 2 includes a first layer 2-*a* and a second layer 2-*b* stacked on each other will be mainly described in detail for convenience of description.

The first layer 2-*a* and the second layer 2-*b* may be sequentially disposed on the support 1. In this regard, the first layer 2-*a* and the second layer 2-*b* may include different materials from each other. For example, one of the first layer 2-*a* and the second layer 2-*b* may include one of metal, metal oxide, metal nitride, and alloy thereof. In addition, the other of the first layer 2-*a* and the second layer 2-*b* may include another of metal, metal oxide, metal nitride, and alloy thereof. In this regard, the metal, metal oxide, metal nitride, and alloy thereof may be the materials described above with reference to FIG. 1A to FIG. 1C.

Although not shown, the mask 3 may also include a plurality of layers. In this regard, the material of each layer may be the same as one of the materials of the mask 3 described with reference to FIG. 1A. In this case, one of the plurality of layers of the mask 3 and another of the plurality of layers of the mask 3 may include different materials from each other.

Figure 6:
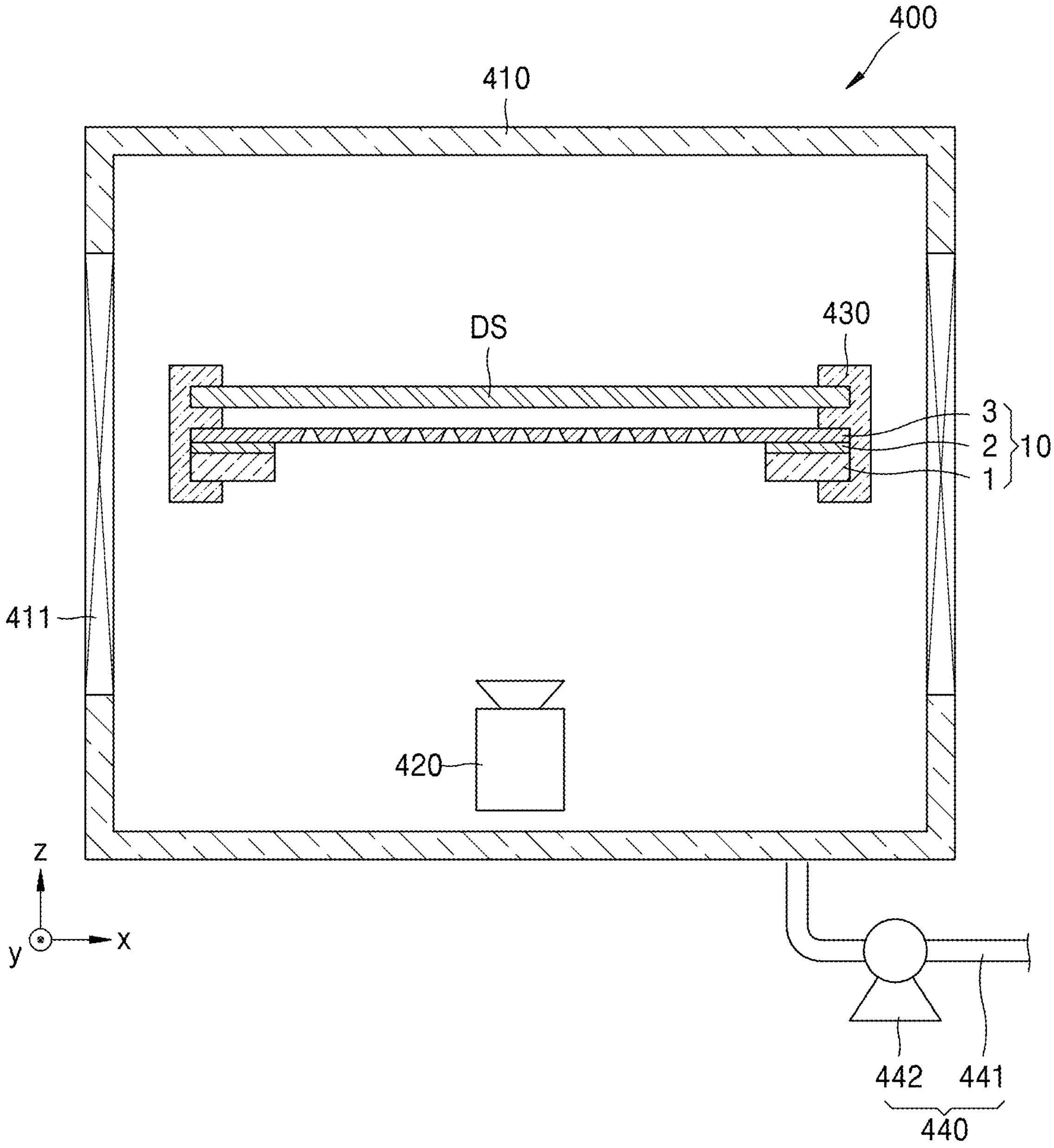
FIG. 6 is a cross-sectional view of an apparatus for manufacturing a display device, according to an embodiment.

FIG. 6 is a cross-sectional view of an apparatus 400 for manufacturing a display device, according to an embodiment.

Referring to FIG. 6, the apparatus 400 may include a chamber 410, a deposition source 420, a fixing portion 430, and a pressure adjuster 440.

The chamber 410 may have a space therein and may include a gate valve 411 that may be opened or closed. When the gate valve 411 is opened, the chamber 410 may be connected to the outside, and when the gate valve 411 is closed, the chamber 410 may be disconnected from the outside.

The deposition source 420 may store a deposition material and may supply the deposition material by applying heat to the deposition material. The deposition source 420 may be fixed to the chamber 410. In another embodiment, the deposition source 420 may linearly move inside the chamber 410.

The fixing portion 430 may support a display substrate DS and the mask assembly 10. In this regard, the fixing portion 430 may support the display substrate DS and the mask assembly 10 together or may separately support the display substrate DS and the mask assembly 10. The fixing portion 430 described above may include one fixing portion 430 or a plurality of fixing portions 430 separable from each other. The fixing portion 430 may have various forms. For example, the fixing portion 430 may be in the form of a shuttle that may linearly move inside the chamber 410 and may move out of the chamber 410. In another embodiment, the fixing portion 430 may be in the form of a member that may linearly move inside the chamber 410. In another embodiment, the fixing portion 430 may be fixed to the inside of the chamber 410. Hereinafter, a case where the fixing portion 430 is in the form of a shuttle that may support the display substrate DS and the mask assembly 10 together and may linearly move inside and outside the chamber 410 will be mainly described in detail for convenience of description.

The mask assembly 10 may include the support 1, the connection portion 2, and the mask 3. The mask assembly 10 is the same as or similar to that described above with reference to FIG. 1A, 3, 4, or 5, and thus, a detailed description thereof is omitted.

The pressure adjuster 440 may be connected to the chamber 410 to control the internal pressure of the chamber 410. In this regard, the pressure adjuster 440 may include a connection pipe 441 connected to the chamber 410 and a pump 442 disposed at the connection pipe 441.

When a display device is manufactured, the display substrate DS may be inserted into the chamber 410 from outside the chamber 410. Layers from a substrate 100 (refer to FIG. 8) described below to a bank layer 1117 (refer to FIG. 8) may have been formed on the display substrate DS.

In the above case, the mask assembly 10 may face the display substrate DS. In this regard, the display substrate DS and the mask assembly 10 may enter the chamber 410 simultaneously by the fixing portion 430 while each being disposed at the fixing portion 430 to face each other. In another embodiment, the display substrate DS and the mask assembly 10 may each enter the chamber 410 from outside the chamber 410 and be disposed at the fixing portion 430.

When the display substrate DS and the mask assembly 10 are arranged inside the chamber 410 as described above, the deposition source 420 may supply a deposition material, thereby depositing the deposition material on the display substrate DS. The deposition material may be one of a variety of layers. For example, when a deposition material is deposited on the display substrate DS, one layer in an intermediate layer 220 (refer to FIG. 8) may be formed. That is, the deposition material may form one of a hole transport layer, a hole injection layer, an emission layer, an electron transport layer, and an electron injection layer. In addition, the deposition material may be disposed at one of a plurality of pixels.

While the above process is in progress, the pressure adjuster 440 may control the internal pressure of the chamber 410. For example, when at least one of the display substrate DS and the mask assembly 10 is inserted into the chamber 410, the pressure adjuster 440 may inject external air into the chamber 410 and maintain the internal pressure of the chamber 410 at a level that is the same as or similar to the level of atmospheric pressure. In addition, while the process is in progress in the chamber 410, the pressure adjuster 440 may maintain the internal pressure of the chamber 410 at a level that is lower than the level of atmospheric pressure by discharging internal air from the inside of the chamber 410 to the outside of the chamber 410.

The apparatus 400 for manufacturing a display device and a method of manufacturing a display device may allow the manufacture of a high-resolution display device having a precise pattern by using the mask assembly 10 including fine pattern holes 3*a*(refer to FIG. 1B).

In addition, the apparatus 400 for manufacturing a display device and the method of manufacturing a display device may allow the deposition of a deposition material on a previously set position of the display substrate DS because the width of the pattern holes 3*a* decreases toward the display substrate DS in a thickness direction (z-axis direction) of the pattern holes 3*a*.

Figure 7:
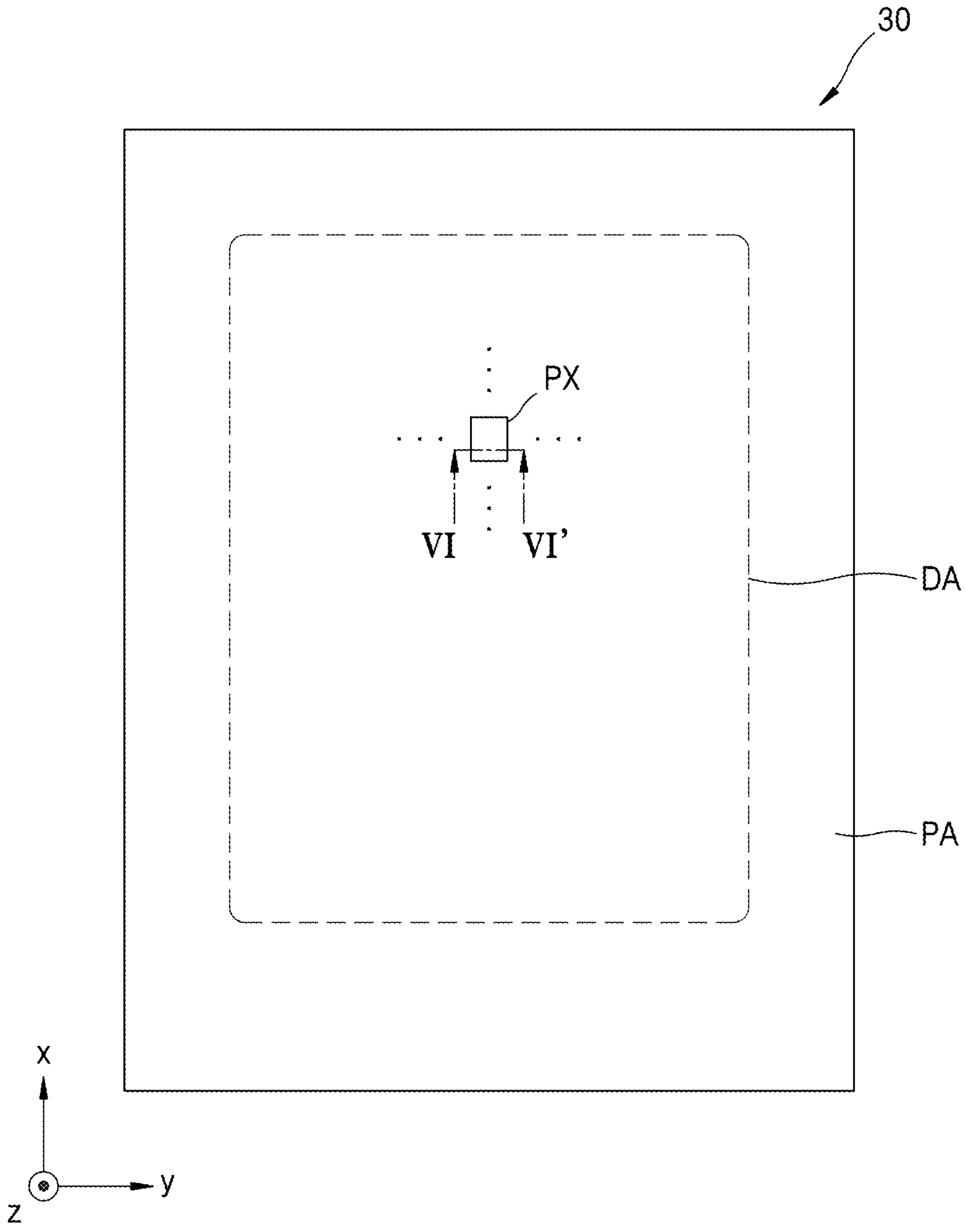
FIG. 7 is a plan view of a display device according to an embodiment.

FIG. 7 is a plan view of a display device 30 according to an embodiment. As used herein, the "plan view" is a view in the thickness direction (z-axis direction) of the mask assembly 10.

Referring to FIG. 7, the display device 30 may include a display area DA and a peripheral area PA outside the display area DA. The display device 30 may provide an image through an array of a plurality of pixels PX two-dimensionally arranged in the display area DA.

The peripheral area PA is an area where no image is provided, and may entirely or partially surround the display area DA. A driver for providing an electrical signal or power to a pixel circuit corresponding to each of the pixels PX may be arranged in the peripheral area PA. A pad, which is an area to which an electronic element or a printed circuit board may be electrically connected, may be arranged in the peripheral area PA.

Although the display device 30 is described below as including an organic light-emitting diode ("OLED") as a light-emitting element, the display device 30 according to one or more embodiments is not limited thereto. In another embodiment, the display device 30 may be a light-emitting display device including an inorganic light-emitting diode, that is, an inorganic light-emitting display. The inorganic light-emitting diode may include a PN junction diode including inorganic semiconductor-based materials. When a voltage is applied to the PN junction diode in a forward direction, holes and electrons are injected, and light of a certain color may be emitted by converting energy generated by recombination of the holes and electrons into light energy. The inorganic light-emitting diode described above may have a width of several to hundreds of micrometers, and in some embodiments, the inorganic light-emitting diode may be referred to as a micro LED. In another embodiment, the display device 30 may be a quantum dot light-emitting display.

The display device 30 may be used as the display screen of not only portable electronic devices, such as a mobile phone, a smartphone, a tablet personal computer (PC), a mobile communication terminal, an electronic notebook, an e-book, a portable multimedia player ("PMP"), a navigation system, and an ultra-mobile PC ("UMPC"), but also various products, such as a television, a notebook computer, a monitor, a billboard, and an Internet of things ("IoT") device. In addition, the display device 30 according to an embodiment may be used in wearable devices, such as a smartwatch, a watch phone, a glasses-type display, and a head-mounted display ("HMD"). In addition, the display device 30 according to an embodiment may be used as a car's instrument panel, a center information display ("CID") on a car's center fascia or dashboard, a room mirror display replacing a car's side mirror, or a display screen on the back of a front seat as entertainment for a car's rear seat.

Figure 8:
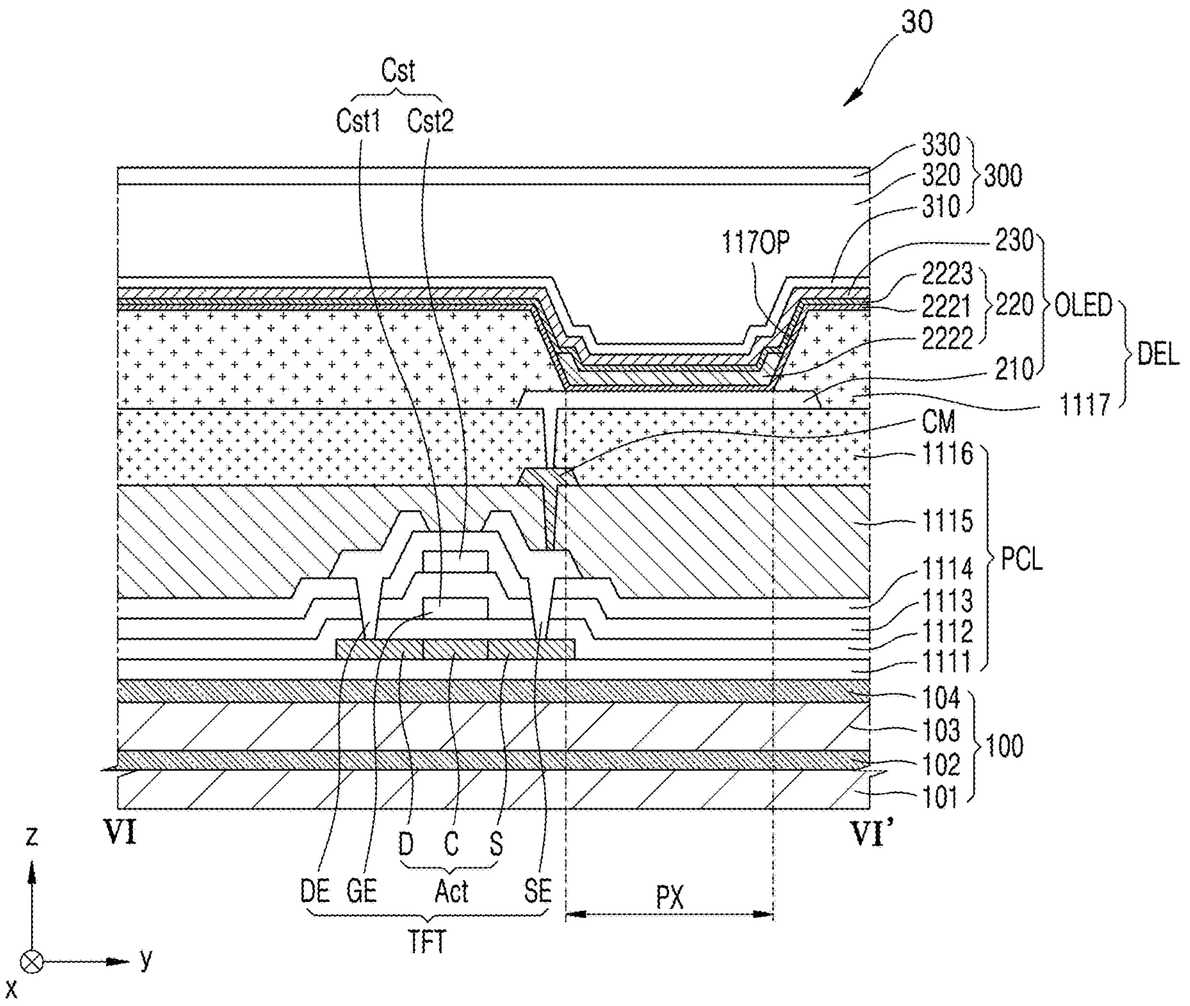
FIG. 8 is a cross-sectional view of a portion of the display device taken along line VI-VI' of FIG. 7.

FIG. 8 is a cross-sectional view of a portion of the display device 30 taken along line VI-VI' of FIG. 7.

Referring to FIG. 8, the display device 30 may include a stacked structure of the substrate 100, a pixel circuit layer PCL, a display element layer DEL, and an encapsulation layer 300. In this regard, a display substrate (not denoted) may be a concept including the substrate 100, the pixel circuit layer PCL, and a portion of the display element layer DEL. That is, the display substrate may range from the substrate 100 to the bank layer 1117.

The substrate 100 may have a multi-layer structure including a base layer and an inorganic layer, the base layer including polymer resin. For example, the substrate 100 may include a base layer including polymer resin, and a barrier layer including an inorganic insulating material. For example, the substrate 100 may include a first base layer 101, a first barrier layer 102, a second base layer 103, and a second barrier layer 104 that are sequentially stacked on one another. The first base layer 101 and the second base layer 103 may include polyimide ("PI"), polyethersulfone ("PES"), polyarylate, polyetherimide ("PEI"), polyethylene naphthalate ("PEN"), polyethylene terephthalate ("PET"), polyphenylene sulfide ("PPS"), polycarbonate, cellulose triacetate ("TAC") and/or cellulose acetate propionate ("CAP"). The first barrier layer 102 and the second barrier layer 104 may include an inorganic insulating material, such as silicon oxide, silicon oxynitride and/or silicon nitride. The substrate 100 may be flexible.

The pixel circuit layer PCL may be disposed on the substrate 100. FIG. 8 shows the pixel circuit layer PCL including a thin-film transistor TFT, and a buffer layer 1111, a first gate insulating layer 1112, a second gate insulating layer 1113, an interlayer-insulating layer 1114, a first planarization insulating layer 1115, and a second planarization insulating layer 1116 disposed under and/or on elements of the thin-film transistor TFT.

The buffer layer 1111 may reduce or prevent penetration of foreign materials, moisture, or external air from below the substrate 100 and may provide a flat surface on the substrate 100. The buffer layer 1111 may include an inorganic insulating material, such as silicon oxide, silicon oxynitride and/or silicon nitride, and may have a single-layer or multi-layer structure including the above-described material.

The thin-film transistor TFT on the buffer layer 1111 may include a semiconductor layer Act, and the semiconductor layer Act may include polysilicon (poly-Si). Alternatively, the semiconductor layer Act may include amorphous silicon (a-Si), an oxide semiconductor, or an organic semiconductor. The semiconductor layer Act may include a channel region C, and a drain region D and a source region S arranged on opposite sides of the channel region C, respectively. A gate electrode GE may overlap the channel region C in a plan view.

The gate electrode GE may include a low-resistance metal material. The gate electrode GE may include a conductive material including molybdenum (Mo), aluminum (Al), copper (Cu), titanium (Ti), etc., and may have a multi-layer or single-layer structure including the above-described material.

The first gate insulating layer 1112 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be zinc oxide (ZnO) and/or zinc peroxide ($ZnO_2$).

The second gate insulating layer 1113 may cover the gate electrode GE. In a similar way to the first gate insulating layer 1112, the second gate insulating layer 1113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be zinc oxide (ZnO) and/or zinc peroxide ($ZnO_2$).

An upper electrode Cst2 of a storage capacitor Cst may be disposed on the second gate insulating layer 1113. The upper electrode Cst2 may overlap the gate electrode GE below in a plan view. In this regard, the gate electrode GE and the upper electrode Cst2 overlapping each other with the second gate insulating layer 1113 therebetween may constitute the storage capacitor Cst. That is, the gate electrode GE may serve as a lower electrode Cst1 of the storage capacitor Cst.

As described above, the storage capacitor Cst and the thin-film transistor TFT may overlap each other. In some embodiments, the storage capacitor Cst may not overlap the thin-film transistor TFT in a plan view.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu), and may have a single-layer or multi-layer structure including the above-described material.

The interlayer-insulating layer 1114 may cover the upper electrode Cst2. The interlayer-insulating layer 1114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be zinc oxide (ZnO) and/or zinc peroxide ($ZnO_2$). The interlayer-insulating layer 1114 may have a single-layer or multi-layer structure including the above-described inorganic insulating material.

A drain electrode DE and a source electrode SE may each be on the interlayer-insulating layer 1114. The drain electrode DE and the source electrode SE may be connected to the drain region D and the source region S, respectively, through contact holes formed in the insulating layers below. The drain electrode DE and the source electrode SE may include a highly conductive material. The drain electrode DE and the source electrode SE may include a conductive material including molybdenum (Mo), aluminum (Al), copper (Cu), titanium (Ti), etc., and may have a multi-layer or single-layer structure including the above-described material. In an embodiment, the drain electrode DE and the source electrode SE may have a multi-layer structure of titanium (Ti)/aluminum (Al)/titanium (Ti).

The first planarization insulating layer 1115 may cover the drain electrode DE and the source electrode SE. The first planarization insulating layer 1115 may include an organic insulating material, such as a general commercial polymer, such as polystyrene ("PS"), polymethylmethacrylate ("PMMA"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The second planarization insulating layer 1116 may be disposed on the first planarization insulating layer 1115. The second planarization insulating layer 1116 may include the same material as the first planarization insulating layer 1115, and may include an organic insulating material, such as a general commercial polymer, such as PS, PMMA, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be disposed on the pixel circuit layer PCL having the above-described structure. The display element layer DEL may include an organic light-emitting diode OLED as a display element (that is, a light-emitting element), and the organic light-emitting diode OLED may include a stacked structure of a pixel electrode 210, the intermediate layer 220, and a common electrode 230. The organic light-emitting diode OLED, for example, may emit red, green, or blue light, or may emit red, green, blue, or white light. The organic light-emitting diode OLED may emit light through an emission area, and the emission area may be defined as the pixel PX.

The pixel electrode 210 of the organic light-emitting diode OLED may be electrically connected to the thin-film transistor TFT through contact holes formed in the second planarization insulating layer 1116 and the first planarization insulating layer 1115 and a contact metal CM disposed on the first planarization insulating layer 1115.

The pixel electrode 210 may include conductive oxide, such as indium tin oxide ("ITO"), indium zinc oxide ("IZO"), zinc oxide (ZnO), indium oxide (In2O3), indium gallium oxide ("IGO"), or aluminum zinc oxide ("AZO"). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a layer formed of ITO, IZO, ZnO, or $In_2O_3$ on/under the above-described reflective layer.

The bank layer 1117 defining an opening 1170P exposing a central portion of the pixel electrode 210 is disposed on the pixel electrode 210. The bank layer 1117 may include an organic insulating material and/or an inorganic insulating material. The opening 1170P may define an emission area of light emitted from the organic light-emitting diode OLED. For example, a size/width of the opening 1170P may correspond to a size/width of the emission area. Accordingly, a size and/or width of the pixel PX may depend on a size and/or width of the corresponding opening 1170P of the bank layer 1117.

The intermediate layer 220 may include an emission layer 2222 corresponding to the pixel electrode 210. The emission layer 2222 may include a high-molecular weight or low-molecular weight organic material emitting light of a certain color. Alternatively, the emission layer 2222 may include an inorganic light-emitting material or quantum dots.

In an embodiment, the intermediate layer 220 may include a first functional layer 2221 and a second functional layer 2223 disposed under and on the emission layer 2222, respectively. The first functional layer 2221 may include, for example, a hole transport layer ("HTL"), or an HTL and a hole injection layer ("HIL"). The second functional layer 2223 is an element disposed on the emission layer 2222, and may include an electron transport layer ("ETL") and/or an electron injection layer ("EIL"). Similar to the common electrode 230 described below, the first functional layer 2221 and/or the second functional layer 2223 may be a common layer covering the entirety of the substrate 100.

At least one layer in the intermediate layer 220 described above may be manufactured through the above-described apparatus 400 for manufacturing a display device. In this regard, the resolution of the display device 30 itself may vary depending on how many at least one layer in the intermediate layer 220 spaced apart from another through the apparatus for manufacturing a display device is arranged in a certain area. In this regard, when at least one layer in the intermediate layer 220 is formed through the above-described apparatus 400 for manufacturing a display device, many layers may be arranged in a certain area by reducing a distance between at least one layer in the intermediate layer 220 apart from another.

The common electrode 230 may be disposed over the pixel electrode 210 and may overlap the pixel electrode 210 in a plan view. The common electrode 230 may include a conductive material having a low work function. For example, the common electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the common electrode 230 may further include a layer, including such as ITO, IZO, ZnO, or $In_2O_3$, on a (semi) transparent layer including the above-described material. The common electrode 230 may be integrally formed to cover the entirety of the substrate 100.

The encapsulation layer 300 may be disposed on the display element layer DEL and may cover the display element layer DEL. The encapsulation layer 300 may include at least one inorganic encapsulation layer and at least one organic encapsulation layer, and as an embodiment, FIG. 8 shows the encapsulation layer 300 including a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include acryl-based resin, epoxy-based resin, polyimide, and polyethylene. In an embodiment, the organic encapsulation layer 320 may include acrylate. The organic encapsulation layer 320 may be formed by curing a monomer or applying a polymer. The organic encapsulation layer 320 may be transparent.

Although not shown, a touch sensor layer may be disposed on the encapsulation layer 300, and an optical functional layer may be disposed on the touch sensor layer. The touch sensor layer may obtain coordinates information according to an external input, for example, a touch event. The optical functional layer may reduce the reflectance of light (external light) incident from the outside toward a display device and/or may improve the color purity of light emitted from the display device. In an embodiment, the optical functional layer may include a phase retarder and/or a polarizer. The phase retarder may be of a film type or a liquid crystal coating type and may include a λ/2 phase retarder and/or a λ/4 phase retarder. The polarizer may also be of a film type or a liquid crystal coating type. The film type may include an elongated synthetic resin film, and the liquid crystal coating type may include liquid crystals arranged in a certain arrangement. The phase retarder and the polarizer may further include a protection film.

An adhesive member may be disposed between the touch sensor layer and the optical functional layer. As the adhesive member, a general one known in the art may be employed without limitation. The adhesive member may be a pressure-sensitive adhesive ("PSA").

Figure 9:
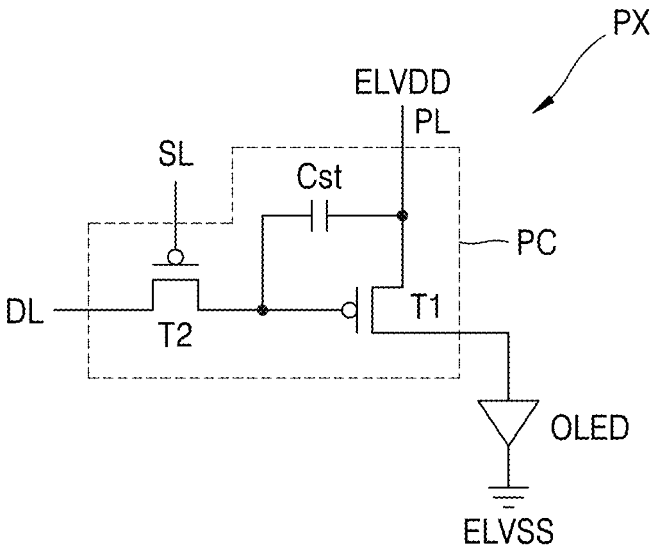
FIG. 9 is an equivalent circuit diagram of one pixel in a display panel, according to an embodiment.

FIG. 9 is an equivalent circuit diagram of one pixel PX in a display panel, according to an embodiment.

Referring to FIG. 9, each pixel PX may include a pixel circuit PC and a display element connected to the pixel circuit PC, for example, the organic light-emitting diode OLED. The pixel circuit PC may include a first thin-film transistor T1, a second thin-film transistor T2, and the storage capacitor Cst. Each pixel PX may emit, for example, red, green, blue, or white light, through the organic light-emitting diode OLED.

The second thin-film transistor T2, which is a switching thin-film transistor, may be connected to a scan line SL and a data line DL, and may be configured to transfer a data voltage input from the data line DL to the first thin-film transistor T1, based on a switching voltage input from the scan line SL. The storage capacitor Cst may be connected to the second thin-film transistor T2 and a driving voltage line PL and may store a voltage corresponding to the difference between a voltage received from the second thin-film transistor T2 and a first power voltage ELVDD supplied to the driving voltage line PL.

The first thin-film transistor T1, which is a driving thin-film transistor, may be connected to the driving voltage line PL and the storage capacitor Cst, and may be configured to control a driving current flowing through the organic light-emitting diode OLED from the driving voltage line PL, in response to a voltage stored in the storage capacitor Cst. The organic light-emitting diode OLED may emit light having certain brightness according to the driving current. An opposite electrode (e.g., a cathode) of the organic light-emitting diode OLED may receive a second power voltage ELVSS.

Although FIG. 9 shows the pixel circuit PC including two thin-film transistors and one storage capacitor, one or more embodiments are not limited thereto. The number of thin-film transistors and the number of storage capacitors may be variously modified according to the design of the pixel circuit PC. For example, the pixel circuit PC may further include four or at least five thin-film transistors in addition to the two thin-film transistors described above.

According to one or more of the embodiments described above, a mask assembly and a method and apparatus for manufacturing a display device may allow the deposition of a deposition material in a precise pattern and the manufacture of a high-resolution display device.

According to one or more of the embodiments described above, a method of manufacturing a mask assembly may allow the manufacture of a mask assembly that is light and has an increased lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:

arranging a substrate and a mask assembly to face a deposition source; and supplying a deposition material from the deposition source to cause the deposition material to pass through the mask assembly and be deposited on the substrate, wherein the mask assembly comprises:

a support defining a first opening therein;

a connection portion defining a second opening therein, arranged on the support, and comprising at least one of metal, metal oxide, metal nitride, and alloy thereof, wherein the second opening corresponds to the first opening; and a mask arranged on the connection portion, configured to shield the first opening and the second opening, and defining a plurality of pattern holes corresponding to the first opening and the second opening, wherein a width of the pattern holes in a plan view decreases in a direction away from the support, from one surface of the mask facing the connection portion to one point of the pattern holes and increases in the direction away from the support, from the one point of the pattern holes to another surface of the mask opposite to the one surface.

2. The method of claim 1, wherein the support comprises silicon.

3. The method of claim 1, wherein the connection portion comprises at least two layers stacked on each other.

4. The method of claim 1, wherein the mask comprises at least one of silicon oxide, silicon nitride, and silicon oxynitride.

5. The method of claim 1, wherein a width of the first opening is the same as a width of the second opening in a plan view.

* * * * *